(12) United States Patent
Cai et al.

(10) Patent No.: US 11,793,061 B2
(45) Date of Patent: Oct. 17, 2023

(54) DISPLAY ASSEMBLY AND DISPLAY DEVICE

(71) Applicant: BOE TECHNOLOGY GROUP CO., LTD., Beijing (CN)

(72) Inventors: Peng Cai, Beijing (CN); Youwei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 92 days.

(21) Appl. No.: 17/488,675

(22) Filed: Sep. 29, 2021

(65) Prior Publication Data

US 2022/0255023 A1 Aug. 11, 2022

(30) Foreign Application Priority Data

Feb. 5, 2021 (CN) .......................... 202110165977.9

(51) Int. Cl.
*H05K 5/00* (2006.01)
*H10K 77/10* (2023.01)
(Continued)

(52) U.S. Cl.
CPC .............. *H10K 77/111* (2023.02); *B32B 3/14* (2013.01); *B32B 7/022* (2019.01); *B32B 7/12* (2013.01);
(Continued)

(58) Field of Classification Search
CPC . H05K 5/0017; H05K 5/0217; H01L 51/0097
(Continued)

(56) References Cited

U.S. PATENT DOCUMENTS 10,747,269 B1 8/2020 Choi et al.
10,904,371 B1 1/2021 Song et al.
(Continued)

FOREIGN PATENT DOCUMENTS

CN 108470853 * 8/2018 ......... H01L 51/0097
CN 109686250 * 4/2019 ............. B32B 7/022
(Continued)

OTHER PUBLICATIONS

China Patent Office, First Office Action dated Jul. 13, 2022, for corresponding Chinese application 202110165977.9.

*Primary Examiner* — Hung S. Bui
(74) *Attorney, Agent, or Firm* — HOUTTEMAN LAW LLC (57) ABSTRACT

Disclosed are a display assembly and a display device. The display assembly includes: a flexible display screen; a support layer located on a non-display side of the flexible display screen; wherein the support layer includes a first support part and a second support part which continuously extend along a plane of the non-display side of the flexible display screen, and the first support part has an elastic modulus smaller than the second support part; and a tensioning member including a first connection part and a second connection part interconnected with each other, wherein the first connection part is located on a side of the first support part away from the flexible display screen, and the second connection part is located on a side of the second support part away from the flexible display screen; and the first connection part has an elastic modulus greater than the second connection part.

16 Claims, 5 Drawing Sheets

(51) Int. Cl.
*B32B 7/022* (2019.01)
*B32B 3/14* (2006.01)
*B32B 7/12* (2006.01)
*B32B 15/04* (2006.01)
*H05K 5/02* (2006.01)
*H10K 50/86* (2023.01)
*H10K 59/40* (2023.01)
*H10K 102/00* (2023.01)

(52) U.S. Cl.
CPC ......... *B32B 15/043* (2013.01); *H05K 5/0017* (2013.01); *H05K 5/0217* (2013.01); *H10K 50/86* (2023.02); *H10K 59/40* (2023.02); *B32B 2307/51* (2013.01); *B32B 2457/208* (2013.01); *H10K 2102/311* (2023.02)

(58) Field of Classification Search
USPC .......................................................... 361/807
See application file for complete search history.

(56) References Cited

U.S. PATENT DOCUMENTS

| | | | | |
|---|---|---|---|---|
| 2016/0101593 | A1* | 4/2016 | Nam | B32B 7/022 428/212 |
| 2018/0103552 | A1* | 4/2018 | Seo | G06F 1/1652 |
| 2021/0354422 | A1* | 11/2021 | Chen | B32B 7/022 |
| 2021/0408402 | A1* | 12/2021 | Zhu | B32B 27/08 |
| 2022/0046811 | A1* | 2/2022 | Kim | G06F 1/1624 |

FOREIGN PATENT DOCUMENTS

| | | |
|---|---|---|
| CN | 111613144 A | 9/2020 |
| CN | 111624845 A | 9/2020 |
| CN | 111862822 A | 10/2020 |
| CN | 111883573 A | 11/2020 |

* cited by examiner

DISPLAY ASSEMBLY AND DISPLAY DEVICE

CROSS-REFERENCE TO RELATED APPLICATION

The present application claims priority to Chinese patent application No. 202110165977.9 filed with the China National Intellectual Property Administration on Feb. 5, 2021, the disclosure of which is incorporated herein by reference in its entirety.

TECHNICAL FIELD

The present disclosure relates to the field of display technology, and particularly relates to a display assembly and a display device.

BACKGROUND

The flexible display device has the characteristics of rollability, wide viewing angle, portability and the like, and thus has a wide application prospect and good market potential in portable products and most display application fields. The flexible slidable and rollable display device may be configured to switch an area of a display region of the flexible display device at will according to the needs of a user, which not only makes the flexible slidable and rollable display device convenient for the user to carry, and provides better use experience for the user, thereby indicating an important direction for the development of the flexible display device.

SUMMARY

To solve at least one of the problems in the related art, the present disclosure provides a display assembly and a display device.

In order to achieve the above objects, the present disclosure provides a display assembly, including:
a flexible display screen;
a support layer located on a non-display side of the flexible display screen; wherein the support layer includes a first support part and a second support part which continuously extend along a plane of the non-display side of the flexible display screen, and the first support part has an elastic modulus smaller than the second support part; and
a tensioning member including a first connection part and a second connection part interconnected with each other, wherein the first connection part is located on a side of the first support part away from the flexible display screen, and the second connection part is located on a side of the second support part away from the flexible display screen; and wherein the first connection part has an elastic modulus greater than the second connection part.

In some embodiments, the first connection part includes: a first base material layer and a first adhesive layer disposed between the first base material layer and the first support part;
the second connection part includes: a second base material layer and a second adhesive layer disposed between the second base material layer and the second support part; and the first base material layer is connected to the second base material layer;
wherein the first base material layer has an elastic modulus greater than the second base material layer, and the first adhesive layer has an elastic modulus greater than the second adhesive layer.

In some embodiments, the first connection part includes: a first base material layer and a first adhesive layer disposed between the first base material layer and the first support part;
the second connection part includes: a second base material layer and a second adhesive layer disposed between the second base material layer and the second support part; and the first base material layer is connected to the second base material layer;
wherein the first base material layer has an elastic modulus greater than the second base material layer, or the first adhesive layer has an elastic modulus greater than the second adhesive layer.

In some embodiments, the first adhesive layer is bonded to the second adhesive layer; or
a gap is provided between the first adhesive layer and the second adhesive layer.

In some embodiments, the first adhesive layer is bonded to the second adhesive layer; or
a gap is provided between the first adhesive layer and the second adhesive layer.

In some embodiments, when a gap is provided between the first adhesive layer and the second adhesive layer, an orthographic projection of an interface line between the first support part and the second support part on the flexible display screen passes through an orthographic projection of the gap region between the first adhesive layer and the second adhesive layer on the flexible display screen.

In some embodiments, the elastic modulus of the first support part is between 10 MPa and 100 MPa, and the elastic modulus of the second support part is between 180 GPa and 200 GPa;
the elastic modulus of the first base material layer is between 5 Gpa and 100 Gpa, and the elastic modulus of the second base material layer is between 0.1 Gpa and 3 Gpa; and
the elastic modulus of the first adhesive layer is between 500 Kpa and 5000 Kpa, and the elastic modulus of the second adhesive layer is between 0 Kpa and 50 Kpa.

In some embodiments, a plurality of support strips are provided on the side of the first support part away from the flexible display screen, the plurality of support strips are arranged along a first direction from the first connection part to the second connection part; and
each of the support strips extends along a second direction crossed with the first direction.

In some embodiments, the first base material layer, the second base material layer, and the support strips are each made of a metal material.

In some embodiments, the first connection part has a thickness equal to the second connection part, and each of the support strips has a thickness greater than or equal to the first connection part.

In some embodiments, a plurality of tensioning members are provided and arranged along the second direction.

In some embodiments, an optical adhesive layer is disposed between the support strip and the first support part, between the first connection part and the first support part, and between the second connection part and the second support part, respectively.

In some embodiments, the first support part is provided with a hollowed-out pattern.

In some embodiments, the flexible display screen includes:
a flexible display substrate;
a spacer layer disposed between the flexible display substrate and the support layer;

a touch layer disposed on a side of the flexible display substrate away from the support layer;

a round polarizer disposed on a side of the touch layer away from the flexible display substrate; and a protective layer disposed on a side of the round polarizer away from the flexible display substrate.

In an embodiment of the present disclosure, there is further provided a display assembly, including:

a flexible display screen;

a support layer located on a non-display side of the flexible display screen; wherein the support layer includes a first support part and a second support part located on at least one side of the first support part, and the first support part has an elastic modulus smaller than the second support part; and a tensioning member including a first connection part and a second connection part, wherein the first connection part is located on a side of the first support part away from the flexible display screen, and the second connection part is located on a side of the second support part away from the flexible display screen; and the first connection part includes: a first base material layer and a first adhesive layer disposed between the first base material layer and the first support part; the second connection part includes: a second base material layer and a second adhesive layer disposed between the second base material layer and the second support part; and the first base material layer is connected to the second base material layer;

wherein the first base material layer has the same elastic modulus as the second base material layer, the first adhesive layer has the same elastic modulus as the second adhesive layer, and a gap is provided between the first adhesive layer and the second adhesive layer, and an orthographic projection of an interface line between the first support part and the second support part on the flexible display screen passes through an orthographic projection of the gap region between the first adhesive layer and the second adhesive layer on the flexible display screen.

In an embodiment of the present disclosure, there is further provided a display device, including:

a fixed casing including a fixed part;

a slid-roll roller shaft; and the display assembly as described above;

wherein the tensioning member further includes: a tensioning part located on a side of the second connection part away from the first connection part, the tensioning part is connected to the second connection part, the flexible display screen is wound around the slid-roll roller shaft, and an end of the flexible display screen away from the first connection part, an end of the tensioning part away from the first connection part are each connected to the fixed part of the fixed casing.

In some embodiments, the display device further includes: a first guide shaft and a second guide shaft each arranged in parallel with the slid-roll roller shaft;

wherein the tensioning part sequentially bypasses the first guide shaft and the second guide shaft, while a distance between the first guide shaft and the fixed part remains constant; and the second guide shaft is configured to rotate about an axis thereof and translate in a direction toward or away from the fixed part.

BRIEF DESCRIPTION OF THE DRAWINGS

Accompanying drawings are provided for further understanding of this disclosure and constitute a part of the specification. Hereinafter, these drawings are intended to explain the disclosure together with the following specific embodiments, but should not be considered as a limitation of the disclosure. In the drawings.

DETAILED DESCRIPTION OF THE EMBODIMENTS

Hereinafter, specific embodiments of the present disclosure will be described with respect to the accompanying drawings. It will be appreciated that the specific embodiments as set forth herein are merely for the purpose of illustration and explanation of the disclosure and should not be constructed as a limitation thereof.

To make the objects, technical solutions and advantages of the disclosure clearer, the technical solutions in the embodiments of the disclosure will now be described clearly and completely with reference to the accompanying drawings of the embodiments of the disclosure. Obviously, the described embodiments are only a part, not all, of the embodiments of the disclosure. Based on the described embodiments of the disclosure, all the other embodiments obtained by those ordinary skilled in the art without any creative labor fall into the protection scope of the disclosure.

The terminology used herein to describe embodiments of the disclosure is not intended to limit and/or define the scope of the disclosure. For example, unless otherwise defined, technical or scientific terms used in the present disclosure are intended to have general meanings as understood by those of ordinary skill in the art. It should be understood that the words "first", "second" and similar terms used in the present disclosure do not denote any order, quantity, or importance, but are used merely for distinguishing different components. The singular forms "a," "an," or "the" and similar referents do not denote a limitation of quantity, but rather denote the presence of at least one, unless the context clearly dictates otherwise. Words like "comprising" or "comprises" means that the element or item preceding the word includes elements or items that appear after the word or equivalents thereof, but does not exclude other elements or items. The terms "connected" or "coupled" and the like are not restricted to physical or mechanical connections, but may include electrical connections, whether direct or indirect. Words like "upper", "lower", "left", "right" are merely used to indicate a relative positional relationship, and when an absolute position of the described object is changed, the relative positional relationship may also be changed accordingly.

Figure 1:
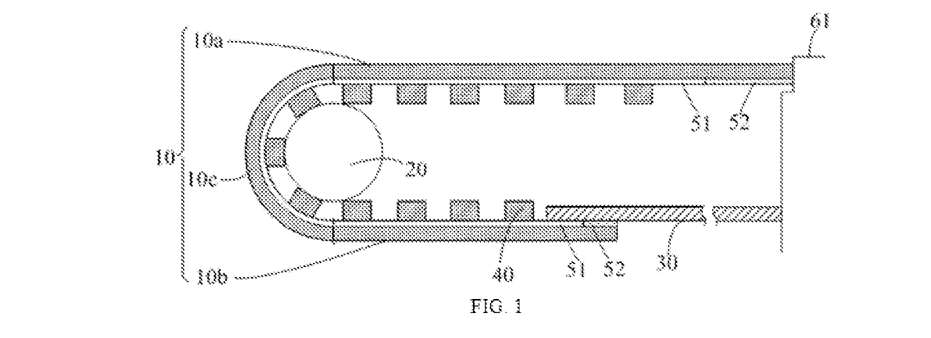
FIG. 1 is a schematic diagram of a flexible slidable and rollable display device provided in an embodiment in an initial state.
Figure 2:
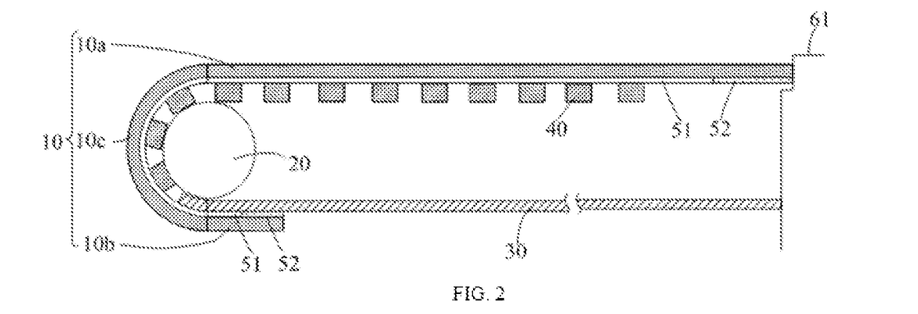
FIG. 2 is a schematic diagram of a flexible slidable and rollable display device provided in an embodiment in an extended state.
Figure 3:
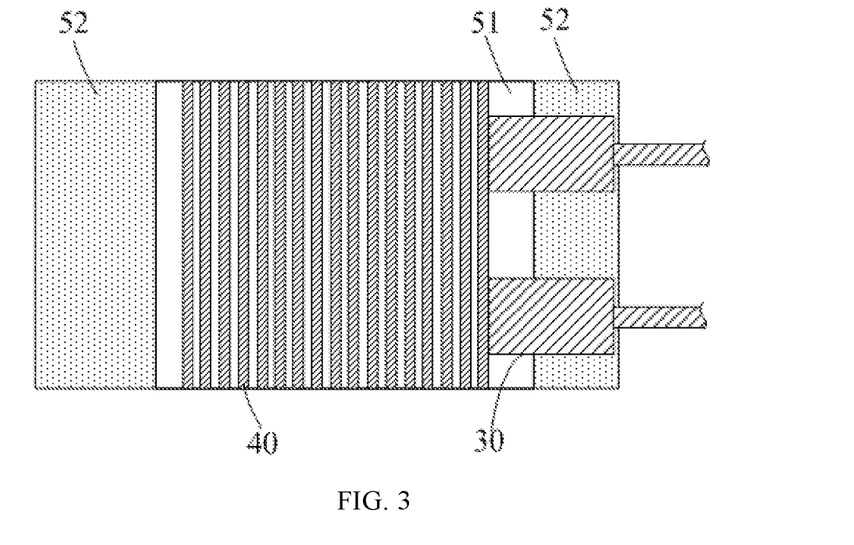
FIG. 3 is a schematic diagram of the flexible display screen and the tensioning member of the flexible slidable and rollable display device of FIG. 1 in a flat state.

FIG. 1 is a schematic diagram of a flexible slidable and rollable display device provided in an embodiment in an initial state. FIG. 2 is a schematic diagram of a flexible slidable and rollable display device provided in an embodiment in an extended state. As shown in FIGS. 1 and 2, the flexible slidable and rollable display device includes: a flexible display screen 10, a slid-roll roller shaft 20 and a tensioning member 30. One end of the tensioning member 30 is fixed on a non-display side of the flexible display screen 10, and the other end thereof is connected to a fixed part 61 of a fixed casing of the flexible slidable and rollable display device. FIG. 3 is a schematic diagram of the flexible display screen and the tensioning member of the flexible slidable and rollable display device of FIG. 1 in a flat state. As shown in FIGS. 1 to 3, a plurality of support strips 40 are provided on the non-display side of the flexible display screen 10.

As shown in FIGS. 1 to 3, the flexible display screen 10 includes a first portion 10a and a second portion 10b disposed opposite to each other, and a third portion 10c connected between the first portion 10a and the second portion 10b. The first portion 10a is connected to the fixed part 61, the second portion 10b is connected to the tensioning member 30, and the third portion 10c is connected between the first portion 10a and the second portion 10b. The first portion 10a is a main display portion of the flexible display screen 10. When the slid-roll roller shaft 20 moves away from the fixed part 61 of the fixed casing and rotate about an axis thereof, the flexible display screen 10 is gradually extended, so that an area of the display region that can be viewed by a user gradually increases.

In order to protect the flexible display screen 10 upon bending, as shown in FIGS. 1 to 3, a backlight side (i.e., the non-display side) of the flexible display screen 10 is further provided with a support layer 50. The support layer 50 includes a first support part 51 and a second support part 52 disposed at different regions, and the second support part 52 may be provided on opposite end sides of the first support part 51. Generally, the first support part 51 has an elastic modulus smaller than the second support part 52, so as to facilitate rolling of the flexible display screen 10. The support strip 40 is disposed on the first support part 51, and the tensioning member 30 includes a portion disposed on the first support part 51 and a portion disposed on the second support part 52.

Since the first support part 51 has a different elastic modulus from the second support part 52, when the slid-roll roller shaft 20 moves to an interface between the first support part 51 and the second support part 52, the stress applied to the flexible display screen 10 at the interface between the first support part 51 and the second support part 52 may suddenly change, and thus cause easy damage to the flexible display screen 10.

Figure 4:
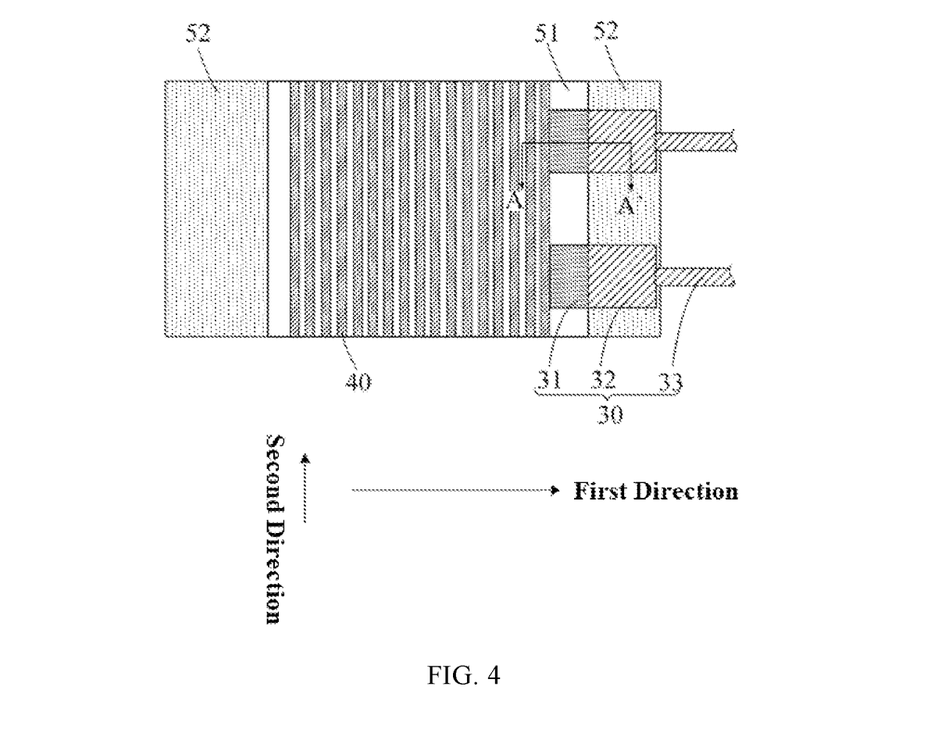
FIG. 4 is a schematic diagram of a display assembly provided in some embodiments of the present disclosure.
Figure 5A:
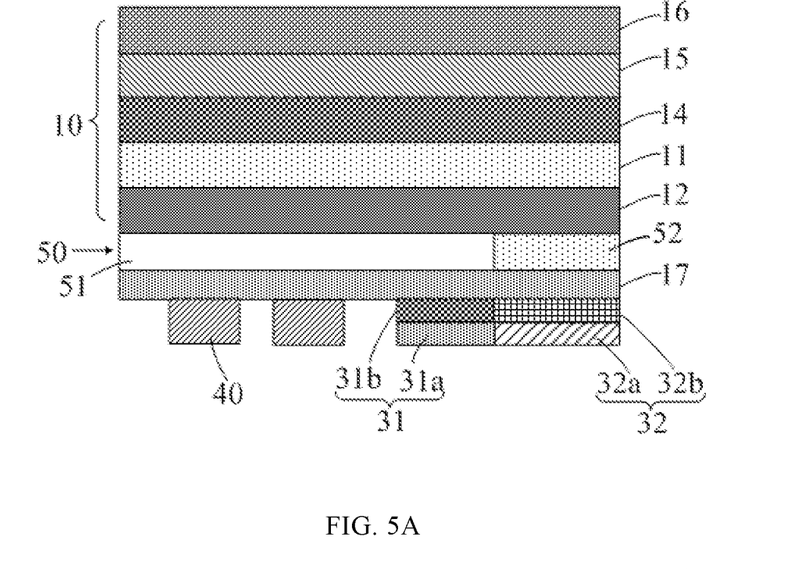
FIG. 5A is a cross-sectional view taken along line A-A' of FIG. 4.
Figure 5B:
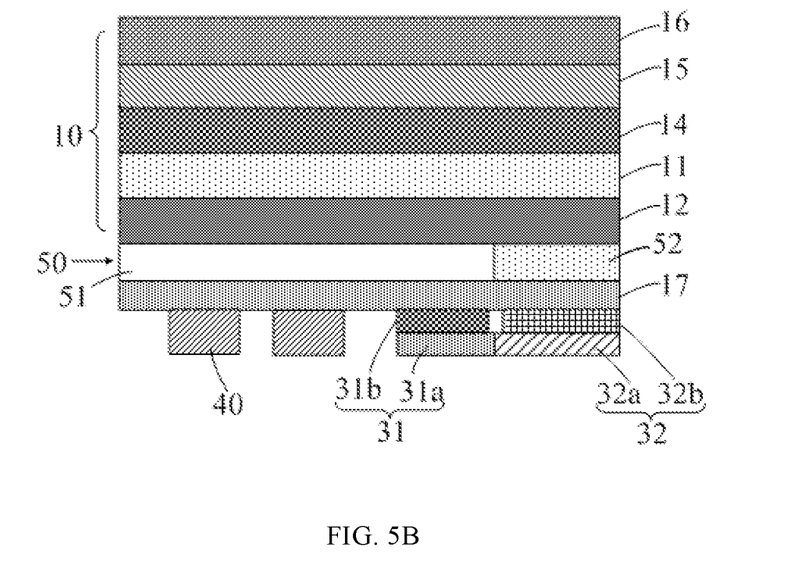
FIG. 5B is another sectional view taken along line A-A' of FIG. 4.

FIG. 4 is a schematic diagram of a display assembly provided in some embodiments of the present disclosure. FIG. 5A is a cross-sectional view taken along line A-A' of FIG. 4. FIG. 5B is another sectional view taken along line A-A' of FIG. 4. As shown in FIGS. 4 to 5B, the display assembly includes: a flexible display screen 10, a support layer 50 and a tensioning member 30. The flexible display screen 10 is, for example, an OLED display screen. The support layer 50 is located on the non-display side of the flexible display screen 10. The support layer 50 includes a first support part 51 and a second support part 52 which continuously extend along a plane of the non-display side of the flexible display screen. In some examples, the second support part 52 is provided on opposite end sides of the first support part 51. The first support part 51 has an elastic modulus smaller than the second support part 52. The non-display side of the flexible display screen 10 refers to a side of the flexible display screen 10 facing away from the display direction. When the flexible display screen 10 is used in a display device and in a bent state, the non-display side of the flexible display screen 10 is an inner side of the flexible display screen 10.

Alternatively, the support layer 50 may be made of a metal material. In an example, the first support part 51 and the second support part 52 may be made of the same material and have the same thickness, and the first support part 51 is provided with a hollowed-out pattern to make the first support part 51 have a smaller elastic modulus.

The tensioning member 30 includes a first connection part 31 and a second connection part 32 interconnected with each other. The first connection part 31 is located on a side of the first support part 51 away from the flexible display screen 10, and the second connection part 32 is located on a side of the second support part 52 away from the flexible display screen 10. That is, an orthographic projection of the first connection part 31 on the flexible display screen 10 is within a range of an orthographic projection of the first support part 51 on the flexible display screen 10, and an orthographic projection of the second connection part 32 on the flexible display screen 10 is within a range of an orthographic projection of the second support part 52 on the flexible display screen 10. The first connection part 31 has an elastic modulus greater than the second connection part 32.

In some embodiments, the display assembly further includes a plurality of support strips 40 arranged along a first direction, each support strip 40 extending along a second direction. The first direction refers to a direction from the first connection part 31 to the second connection part 32. The second direction intersects the first direction. For example, the second direction is perpendicular to the first direction.

Figure 6:
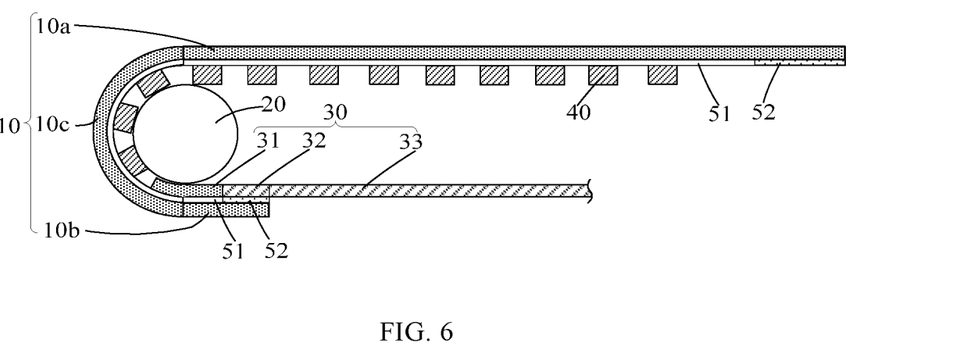
FIG. 6 is a schematic diagram showing a state of the display assembly used in a flexible display device according to the present disclosure.

FIG. 6 is a schematic diagram showing a state of the display assembly used in a flexible display device according to the present disclosure. As shown in FIGS. 4 to 6, when the flexible display screen 10 is wound around the slid-roll roller shaft 20, and the slid-roll roller shaft 20 moves to the interface between the first support part 51 and the second support part 52 of the support layer 50, the slid-roll roller shaft 20 is supported by the first connection part 31 and the second connection part 32. Since the first support part 51 has an elastic modulus smaller than the second support part 52, while the first connection part 31 has an elastic modulus greater than the second connection part 32, a total elastic modulus of the first support part 51 and the first connection part 31 is much closer to a total elastic modulus of the second support part 52 and the second connection part 32. Compared with the structure of FIG. 2, the stress applied to the flexible display screen 10 of FIG. 6 at the interface between the first support part 51 and the second support part 52 will not suddenly change, so as to prevent the flexible display screen 10 from being damaged due to the suddenly changed stress.

In some embodiments, the first connection part 31 includes: a first base material layer 31a and a first adhesive layer 31b disposed between the first base material layer 31a and the first support part 51. The second connection part 32 includes: a second base material layer 32a and a second adhesive layer 32b disposed between the second base material layer 32a and the second support part 52. The first base material layer 31a is connected to the second base material layer 32a; the first base material layer 31a has an elastic modulus greater than the second base material layer 32a, and/or, the first adhesive layer 31b has an elastic modulus greater than the second adhesive layer 32b.

In some examples, the elastic modulus of the first support part 51 is between 10 MPa and 100 MPa, for example, about 50 Mpa, and the elastic modulus of the second support part 52 is between 180 GPa and 200 GPa, for example, about 190 Gpa. The elastic modulus of the first base material layer 31a is between 5 Gpa and 100 Gpa, for example, 10 Gpa; and the elastic modulus of the second base material layer 32a is between 0.1 Gpa and 3 Gpa, for example, 2 Gpa. The elastic modulus of the first adhesive layer 31b is between 500 Kpa and 5000 Kpa, for example, 800 Kpa; and the elastic modulus of the second adhesive layer 32b is between 0 Kpa and 50 Kpa, for example, 20 Kpa.

The first base material layer 31a, the second base material layer 32a and the support strips 40 may each be made of a metal material, so that the support strips 40 and the tensioning member 30 are prevented from being damaged after being used for a long time, and thus the service life of the display assembly is prolonged.

In some embodiments, as shown in FIG. 5A, the first adhesive layer 31b is bonded to the second adhesive layer 32b. In other embodiments, as shown in FIG. 5B, a gap is provided between the first adhesive layer 31b and the second adhesive layer 32b. An interface line of the first support part 51 and the second support part 52 passes through the gap region between the first adhesive layer 31b and the second adhesive layer 32b. That is, an orthographic projection of the interface line between the first support part 51 and the second support part 52 on the flexible display screen passes through an orthographic projection of the gap region between the first adhesive layer 31b and the second adhesive layer 32b on the flexible display screen. In this manner, when the slid-roll roller shaft of the display device moves to the interface between the first support part 51 and the second support part 52, the tensioning member 30 applies a smaller pressure on the flexible display screen 10 at the interface, thereby further preventing the flexible display screen 10 from being damaged.

In some embodiments, as shown in FIGS. 5A and 5B, an optical adhesive layer 17 is disposed between the support strip 40 and the first support part 51, between the first connection part 31 and the first support part 51, and between the second connection part 32 and the second support part 52, respectively.

The optical adhesive layer 17 has uniform thickness at various positions, and the first connection part 31 has a thickness equal to the second connection part 32, so that when the slid-roll roller shaft 20 moves to an interface between the first connection parts 31 and the second connection part 32, portions of the flexible display screen 10 corresponding to the first connection part 31 and the second connection part 32 may remain flat to prevent the flexible display screen 10 from being damaged after repeated rolling.

In addition, the support strip 40 has a thickness greater than or equal to the first connection part 31 and the second connection part 32, so that when the slid-roll roller shaft 20 contacts both the support strip 40 and the first connection part 31, the flexible display screen 10 has gentle transition. In some examples, the thickness of the support strip 40 substantially equals to the thickness of the first connection part 31 and the second connection part 32, so that when the flexible display screen 10 is in a flat state, an end of the support strip 40 away from the flexible display screen 10, a surface of the first connection part 31 away from the first support part 51, and a surface of the second connection part 32 away from the second support part 52 are substantially flush with each other; and when the flexible display screen 10 is wound around the slid-roll roller shaft 20, support forces at various positions of the flexible display screen 10 are substantially the same.

In addition, as shown in FIG. 4, a plurality of tensioning members 30 are provided and arranged along the second direction, so that during movement of the slid-roll roller shaft 20, the flexible display screen 10 can be steadily extended, while preventing the problem of stress concentration in the width direction of the flexible display screen 10. For example, two tensioning members 30 are provided.

As shown in FIGS. 5A and 5B, the flexible display screen 10 includes: a flexible display substrate 11, a spacer layer 12, a touch layer 14, a round polarizer 15 and a protective layer 16. The flexible display substrate 11 may include: a base, a light emitting device (e.g., an organic electroluminescent device) disposed on the base, and a pixel circuit providing a driving signal to the light emitting device. The spacer layer 12 is disposed between the flexible display substrate 11 and the support layer 50, and may include a foam pad and a bonding material disposed on the foam pad. The spacer layer 12 is bonded to the flexible display substrate 11, and the support layer 50 is bonded to the spacer layer 12. The touch layer 14 is disposed on a side of the flexible display substrate 11 away from the support layer 50 and configured to detect occurrence of touch. The round polarizer 15 is disposed on a side of the touch layer 14 away from the flexible display substrate 11, and configured to reduce a reflection effect of a metal electrode (e.g., a cathode of an organic light emitting device) in the flexible display substrate 11 on external ambient light, so as to improve a display effect of the flexible display screen 10. The protective layer 16 is disposed on a side of the round polarizer 15 away from the flexible display substrate 11.

Figure 7:
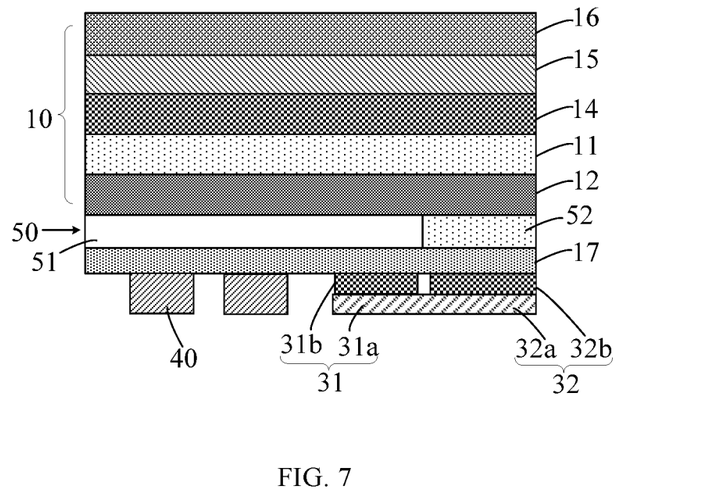
FIG. 7 is a cross-sectional view of a display assembly provided in further embodiments of the present disclosure.

FIG. 7 is a cross-sectional view of a display assembly provided in further embodiments of the present disclosure. The structure of FIG. 7 is similar to that of FIG. 5B, except that: in FIG. 7, the first base material layer 31a may have the same elastic modulus as the second base material layer 32a, the first adhesive layer 31b may have the same elastic modulus as the second adhesive layer 32b, a gap is provided between the first adhesive layer 31b and the second adhesive layer 32b, and an orthographic projection of the interface line between the first support part 51 and the second support part 52 of the support layer 50 on the flexible display screen 10 passes through an orthographic projection of the gap region between the first adhesive layer 31b and the second adhesive layer 32b on the flexible display screen 10. In this case, when the slid-roll roller shaft of the display device moves to the interface between the first support part 51 and the second support part 52, the tensioning member 30 applies a smaller pressure on the flexible display screen 10 at the interface, thereby preventing the flexible display screen 10 from being damaged.

Figure 8:
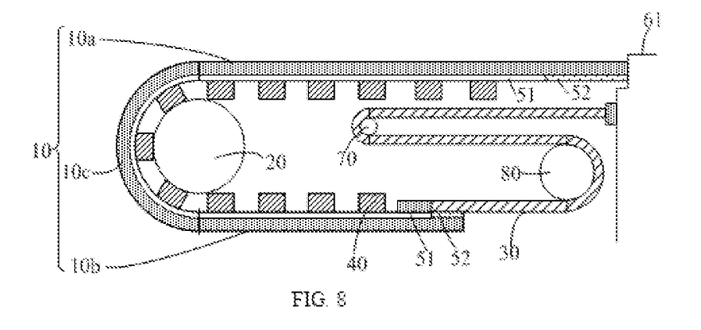
FIG. 8 is a schematic diagram of a display device provided in some embodiments of the present disclosure in an initial state.
Figure 9:
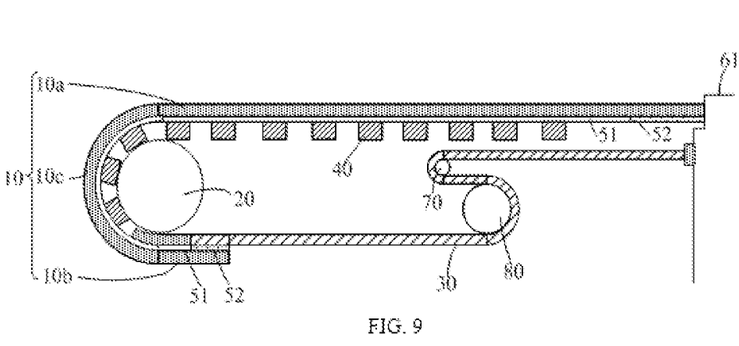
FIG. 9 is a schematic diagram of a display device provided in some embodiments of the present disclosure in an extended state.

In an embodiment of the present disclosure, there is further provided a display device. FIG. 8 is a schematic diagram of a display device provided in some embodiments of the present disclosure in an initial state. FIG. 9 is a schematic diagram of a display device provided in some embodiments of the present disclosure in an extended state. As shown in FIGS. 8 and 9, the display device includes: a fixed casing, a slid-roll roller shaft 20, and a display assembly according to any of the above embodiments. The tensioning member 30 further includes a tensioning part 33 located on a side of the second connection part 32 away from the first connection part 31. The tensioning part 33 is connected to the second connection part 32. The fixed casing includes a fixed part 61. The flexible display screen 10 is wound around the slid-roll roller shaft 20, and an end of the flexible display screen 10 away from a first region A1, and an end of the tensioning part 33 away from the first connection part 31 are each connected to the fixed part 61 of the fixed casing. The slid-roll roller shaft 20 is configured to rotate about an axis thereof and translate in a direction toward or away from the fixed part 61.

In FIGS. 8 and 9, the picture displayed by the first portion 10a of the flexible display screen 10 is a picture that can be seen by a user, and by adjusting a distance between the slid-roll roller shaft 20 and the fixed part 61, an area of the first portion 10a, and thus the actual display area of the display device, are adjusted.

The tensioning member 30 may exert a tensile force on the flexible display screen 10 during the movement of the slid-roll roller shaft 20 toward or away from the fixed part 61, thereby preventing the flexible display screen 10 from being wrinkled.

The specific structure of the tensioning member 30 and its installation form in the display device are not limited in this disclosure, and in a specific example, the tensioning member 30 is made of an organic material (e.g., polyimide) having high flexibility. As shown in FIGS. 8 and 9, the display device further includes a first guide shaft 70 and a second guide shaft 80 each arranged in parallel with the slid-roll roller shaft 20; the tensioning part 33 sequentially bypasses the first guide shaft 70 and the second guide shaft 80, while a distance between the first guide shaft 70 and the fixed part 61 remains constant; and the second guide shaft 80 is configured to rotate about an axis thereof and translate in a direction toward or away from the fixed part 61. Optionally, the first guide shaft 70 has a diameter smaller than the second guide shaft 80, and the second guide shaft 80 has a diameter smaller than the slid-roll roller shaft 20.

The display device may further include: a driver structure configured to drive rotation of the slid-roll roller shaft 20, the first guide shaft 70 and the second guide shaft 80, and drive translation of the slid-roll roller shaft 20 and the second guide shaft 80. For example, when the driver structure drives the slid-roll roller shaft 20 and the second guide shaft 80 to move away from the fixed part 61, and drives the slid-roll roller shaft 20 and the second guide shaft 80 to rotate about their respective axes, the display device may be switched from the initial state shown in FIG. 8 to the extended state shown in FIG. 9. when the driver structure drives the slid-roll roller shaft 20 and the second guide shaft 80 to move toward the fixed part 61, and drives the slid-roll roller shaft 20 and the second guide shaft 80 to rotate about their respective axes, the display device may be switched from the extended state shown in FIG. 9 to the initial state shown in FIG. 8.

It should be noted that the tensioning member 30 may be installed in other manners. For example, the tensioning member 30 includes the first connection part 31 and the second connection part 32 as described above, and an elastic part (for example, a spring or the like). One end of the elastic part is connected to the second connection part 32, while the other end is directly connected to the fixed part 61 without providing the first guide shaft 70 and the second guide shaft 80.

It will be appreciated that the above implementations are merely exemplary implementations for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A display assembly, comprising:
   a flexible display screen;
   a support layer located on a non-display side of the flexible display screen; wherein the support layer comprises a first support part and a second support part which continuously extend along a plane of the non-display side of the flexible display screen, and the first support part has an elastic modulus smaller than the second support part; and
   a tensioning member comprising a first connection part and a second connection part interconnected with each other, wherein the first connection part is located on a side of the first support part away from the flexible display screen, and the second connection part is located on a side of the second support part away from the flexible display screen; and wherein the first connection part has an elastic modulus greater than the second connection part,
   wherein the first connection part comprises: a first base material layer and a first adhesive layer disposed between the first base material layer and the first support part;
   the second connection part comprises: a second base material layer and a second adhesive layer disposed between the second base material layer and the second support part; and the first base material layer is connected to the second base material layer;
   wherein the first base material layer has an elastic modulus greater than the second base material layer, and the first adhesive layer has an elastic modulus greater than the second adhesive layer.

2. The display assembly according to claim 1, wherein the first connection part comprises: a first base material layer and a first adhesive layer disposed between the first base material layer and the first support part;
   the second connection part comprises: a second base material layer and a second adhesive layer disposed between the second base material layer and the second support part; and the first base material layer is connected to the second base material layer;
   wherein the first base material layer has an elastic modulus greater than the second base material layer, or the first adhesive layer has an elastic modulus greater than the second adhesive layer.

3. The display assembly according to claim 2, wherein the first adhesive layer is bonded to the second adhesive layer; or
   a gap is provided between the first adhesive layer and the second adhesive layer.

4. The display assembly according to claim 1, wherein the first adhesive layer is bonded to the second adhesive layer; or
   a gap is provided between the first adhesive layer and the second adhesive layer.

5. The display assembly according to claim 4, wherein when a gap is provided between the first adhesive layer and the second adhesive layer, an orthographic projection of an interface line between the first support part and the second support part on the flexible display screen passes through an orthographic projection of the gap region between the first adhesive layer and the second adhesive layer on the flexible display screen.

6. The display assembly according to claim 1, wherein the elastic modulus of the first support part is between 10 MPa and 100 MPa, and the elastic modulus of the second support part is between 180 GPa and 200 GPa;
the elastic modulus of the first base material layer is between 5 Gpa and 100 Gpa, and the elastic modulus of the second base material layer is between 0.1 Gpa and 3 Gpa; and
the elastic modulus of the first adhesive layer is between 500 Kpa and 5000 Kpa, and the elastic modulus of the second adhesive layer is between 0 Kpa and 50 Kpa.

7. The display assembly according to claim 1, wherein a plurality of support strips are provided on the side of the first support part away from the flexible display screen, the plurality of support strips are arranged along a first direction from the first connection part to the second connection part; and
each of the support strips extends along a second direction crossed with the first direction.

8. The display assembly according to claim 7, wherein the first base material layer, the second base material layer, and the support strips are each made of a metal material.

9. The display assembly according to claim 7, wherein the first connection part has a thickness equal to the second connection part, and each of the support strips has a thickness greater than or equal to the first connection part.

10. The display assembly according to claim 7, wherein a plurality of tensioning members are provided and arranged along the second direction.

11. The display assembly according to claim 7, wherein an optical adhesive layer is disposed between the support strip and the first support part, between the first connection part and the first support part, and between the second connection part and the second support part, respectively.

12. The display assembly according to claim 1, wherein the first support part is provided with a hollowed-out pattern.

13. The display assembly according to claim 1, wherein the flexible display screen comprises:
a flexible display substrate;
a spacer layer disposed between the flexible display substrate and the support layer;
a touch layer disposed on a side of the flexible display substrate away from the support layer;
a round polarizer disposed on a side of the touch layer away from the flexible display substrate; and
a protective layer disposed on a side of the round polarizer away from the flexible display substrate.

14. A display device, comprising:
a fixed casing comprising a fixed part;
a slid-roll roller shaft; and
the display assembly of claim 1;
wherein the tensioning member further comprises: a tensioning part located on a side of the second connection part away from the first connection part, the tensioning part is connected to the second connection part, the flexible display screen is wound around the slid-roll roller shaft, and an end of the flexible display screen away from the first connection part, an end of the tensioning part away from the first connection part are each connected to the fixed part of the fixed casing.

15. The display device according to claim 14, wherein the display device further comprises: a first guide shaft and a second guide shaft each arranged in parallel with the slid-roll roller shaft;
wherein the tensioning part sequentially bypasses the first guide shaft and the second guide shaft, while a distance between the first guide shaft and the fixed part remains constant; and
the second guide shaft is configured to rotate about an axis thereof and translate in a direction toward or away from the fixed part.

16. A display assembly, comprising:
a flexible display screen;
a support layer located on a non-display side of the flexible display screen; wherein the support layer comprises a first support part and a second support part located on at least one side of the first support part, and the first support part has an elastic modulus smaller than the second support part; and
a tensioning member comprising a first connection part and a second connection part,
wherein the first connection part is located on a side of the first support part away from the flexible display screen, and the second connection part is located on a side of the second support part away from the flexible display screen; the first connection part comprises: a first base material layer and a first adhesive layer disposed between the first base material layer and the first support part; the second connection part comprises: a second base material layer and a second adhesive layer disposed between the second base material layer and the second support part; and the first base material layer is connected to the second base material layer;
wherein the first base material layer has the same elastic modulus as the second base material layer, the first adhesive layer has the same elastic modulus as the second adhesive layer, and a gap is provided between the first adhesive layer and the second adhesive layer, and an orthographic projection of an interface line between the first support part and the second support part on the flexible display screen passes through an orthographic projection of the gap region between the first adhesive layer and the second adhesive layer on the flexible display screen.

* * * * *